(12) United States Patent
Uemura

(10) Patent No.: US 8,513,999 B2
(45) Date of Patent: Aug. 20, 2013

(54) SEMICONDUCTOR DEVICE

(75) Inventor: Taiki Uemura, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/308,669

(22) Filed: Dec. 1, 2011

(65) Prior Publication Data

US 2012/0194247 A1    Aug. 2, 2012

(30) Foreign Application Priority Data

Jan. 27, 2011 (JP) ................... 2011-015244

(51) Int. Cl.
*H03K 3/356* (2006.01)

(52) U.S. Cl.
USPC ............ 327/203; 327/212; 327/218; 327/565

(58) Field of Classification Search
USPC ............... 327/199, 202, 203, 212–214, 218, 327/564, 565
See application file for complete search history.

(56) References Cited

U.S. PATENT DOCUMENTS

| | | | |
|---|---|---|---|
| 4,933,576 A | 6/1990 | Tamamura et al. | |
| 7,504,703 B2 | 3/2009 | Yoshida | |
| 7,564,093 B2 | 7/2009 | Matsuda | |
| 8,356,217 B2 * | 1/2013 | Yamanaka et al. | 327/202 |
| 2011/0032016 A1 * | 2/2011 | Maeno | 327/203 |

FOREIGN PATENT DOCUMENTS

| | | |
|---|---|---|
| JP | 1-287944 | 11/1989 |
| JP | 2006-196841 | 7/2006 |
| JP | 2007-80945 | 3/2007 |

* cited by examiner

*Primary Examiner* — Long Nguyen
(74) *Attorney, Agent, or Firm* — Fujitsu Patent Center

(57) ABSTRACT

A semiconductor device includes: a first master-slave flip-flop having a first master latch which receives and latches first data signal in synchronism with first clock and a first slave latch which receives and latches the first data signal from the first master latch in synchronism with second clock; and a second master-slave flip-flop disposed side by side with the first master-slave flip-flop and having a second master latch which receives and latches second data signal in synchronism with third clock and a second slave latch which receives and latches the second data signal from the second master latch in synchronism with fourth clock, and wherein the second slave latch of the second master-slave flip-flop is disposed adjacent to the first master latch of the first master-slave flip-flop and the second master latch of the second master-slave flip-flop is disposed adjacent to the first slave latch of the first master-slave flip-flop.

10 Claims, 12 Drawing Sheets

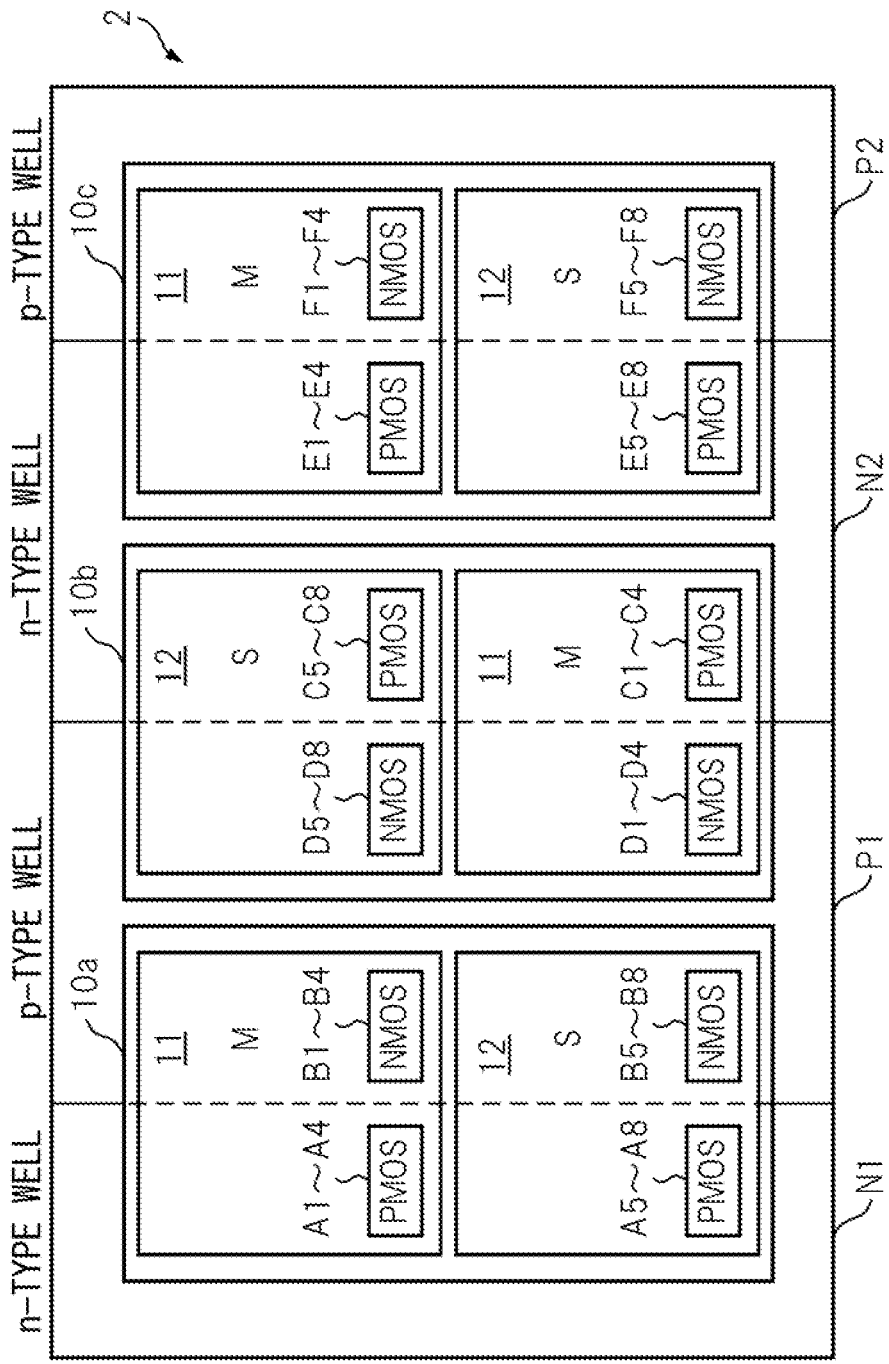

SEMICONDUCTOR DEVICE

CROSS-REFERENCE TO RELATED APPLICATIONS

This application is based upon and claims the benefit of priority of the prior Japanese Patent Application No. 2011-015244, filed on Jan. 27, 2011, the entire contents of which are incorporated herein by reference.

FIELD

The present invention relates to a semiconductor device.

BACKGROUND

It is known in the art to provide a semiconductor device having a master-slave flip-flop circuit.

The master-slave flip-flop circuit is a storage circuit having a master latch circuit which receives and latches a data signal in synchronism with a clock signal and a slave latch circuit which receives and latches the data signal from the master latch circuit in synchronism with a clock signal.

For example, a semiconductor device such as a central processing unit stores bit information using a master-slave flip-flop circuit. Then, using a flip-flop circuit set constructed by arranging a plurality of such master-slave flip-flop circuits, a bit set of a plurality of bits is formed and one word of information is thus stored.

With the trend toward higher integration levels of circuit elements forming semiconductor devices, the operating voltage of the circuit elements has been decreasing, giving rise to the problem that the stored bit information may be destroyed due to a soft error. A soft error is a phenomenon in which electron-hole pairs are generated by energetic particles such as a-particles or neutrons impinging on circuit elements and the bit information is destroyed by the generated carriers. Decreasing operating voltage of the circuit elements makes the stored bit information more susceptible to soft errors.

To address the above problem, a semiconductor device, such as a central processing unit, detects the occurrence of an error due to a soft error or the like by using one-bit parity information appended to the bit set that forms one word of information.

Japanese Laid-open Patent Publication No. 2007-80945
Japanese Laid-open Patent Publication No. 1-287944
Japanese Laid-open Patent Publication No. 2006-196841

If an error occurs in one of the plurality of stored bits forming one word of information, it is possible to detect that an error has occurred in one of the bits by using the above-described parity bit.

However, if an error occurs simultaneously in two or an even number of bits among the plurality of stored bits forming one word of information, it is not possible with one-bit parity information to detect that an error has occurred in the one word of information.

To prevent the occurrence of soft errors, it is proposed, for example, to provide a device isolation layer between two master-slave flip-flip circuits, but the provision of such a device isolation layer involves the problem that the device area increases.

SUMMARY

According to an aspect of the embodiment disclosed in this specification, there is provided a semiconductor device which includes: a first master-slave flip-flop circuit having a first master latch circuit which receives and latches a first data signal in synchronism with a first clock signal and a first slave latch circuit which receives and latches the first data signal from the first master latch circuit in synchronism with a second clock signal; and a second master-slave flip-flop circuit disposed side by side with the first master-slave flip-flop circuit and having a second master latch circuit which receives and latches a second data signal in synchronism with a third clock signal and a second slave latch circuit which receives and latches the second data signal from the second master latch circuit in synchronism with a fourth clock signal, and wherein the second slave latch circuit of the second master-slave flip-flop circuit is disposed adjacent to the first master latch circuit of the first master-slave flip-flop circuit, and the second master latch circuit of the second master-slave flip-flop circuit is disposed adjacent to the first slave latch circuit of the first master-slave flip-flop circuit.

According to an aspect of the embodiment disclosed in this specification, there is provided a semiconductor device which includes: an arrangement of a plurality of master-slave flip-flop circuits each having a master latch circuit which receives and latches a first data signal in synchronism with a first clock signal and a slave latch circuit which receives and latches the first data signal from the master latch circuit in synchronism with a second clock signal, and wherein the master latch circuit of one of the master-slave flip-flop circuits is disposed adjacent to the slave latch circuit of another one of the master-slave flip-flop circuits, and the slave latch circuit of the one master-slave flip-flop circuit is disposed adjacent to the master latch circuit of that other master-slave flip-flop circuit.

The object and advantages of the invention will be realized and attained by means of the elements and combinations particularly indicated in the claims.

It is to be understood that both the foregoing general description and the following detailed description are exemplary and explanatory and are not restrictive of the invention, as claimed.

BRIEF DESCRIPTION OF DRAWINGS

FIG. 12 is a diagram illustrating a fourth modified example of the third embodiment of the semiconductor device disclosed in this specification.

DESCRIPTION OF EMBODIMENTS

[a] First Embodiment

A first preferred embodiment of a semiconductor device disclosed in this specification will be described below with reference to drawings. However, it should be noted that the technical scope of the present invention is not limited to the specific embodiments described herein but extends to the inventions described in the appended claims and their equivalents.

Figure 1:
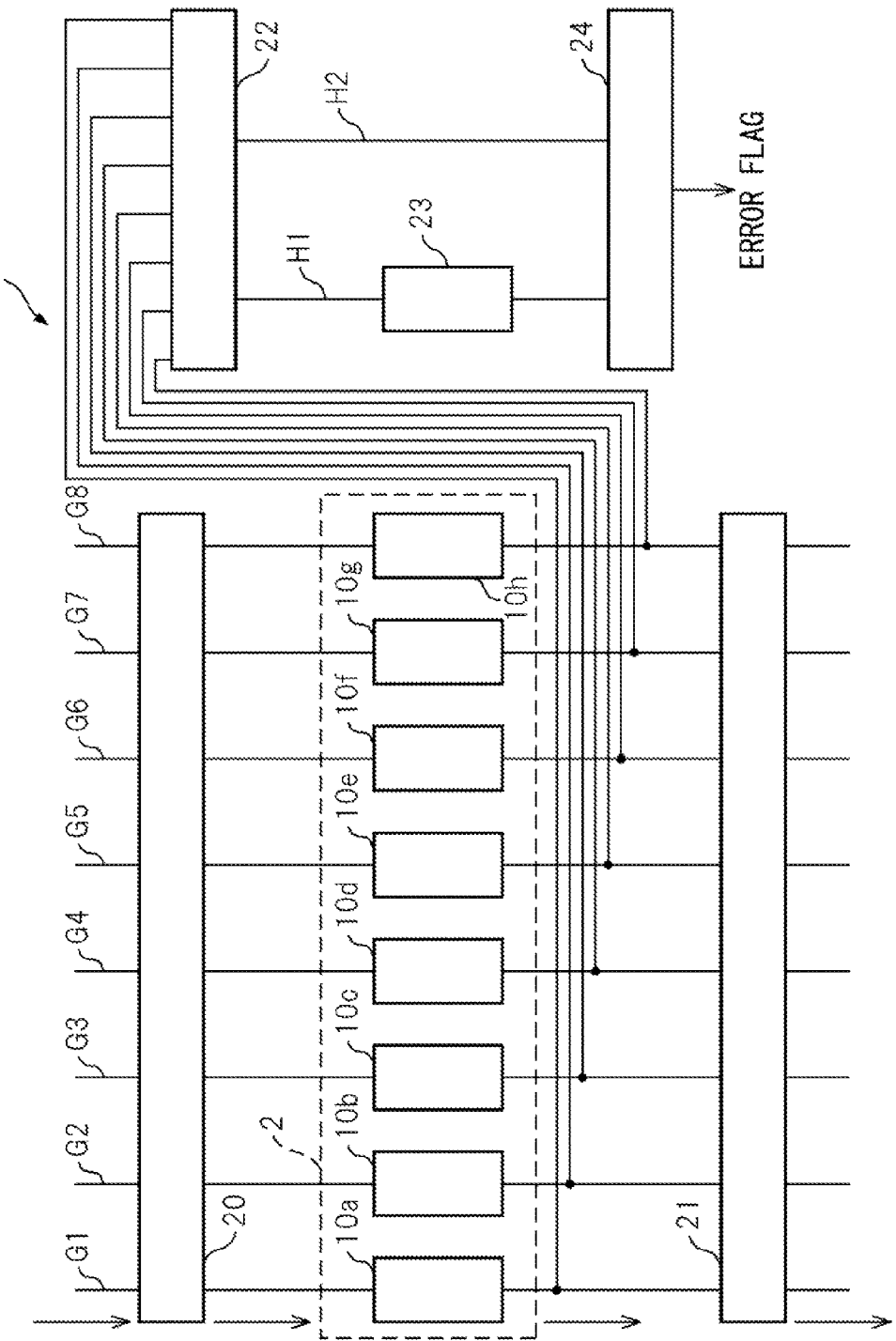
FIG. 1 is a diagram illustrating a first embodiment of a semiconductor device disclosed in this specification.
Figure 2:
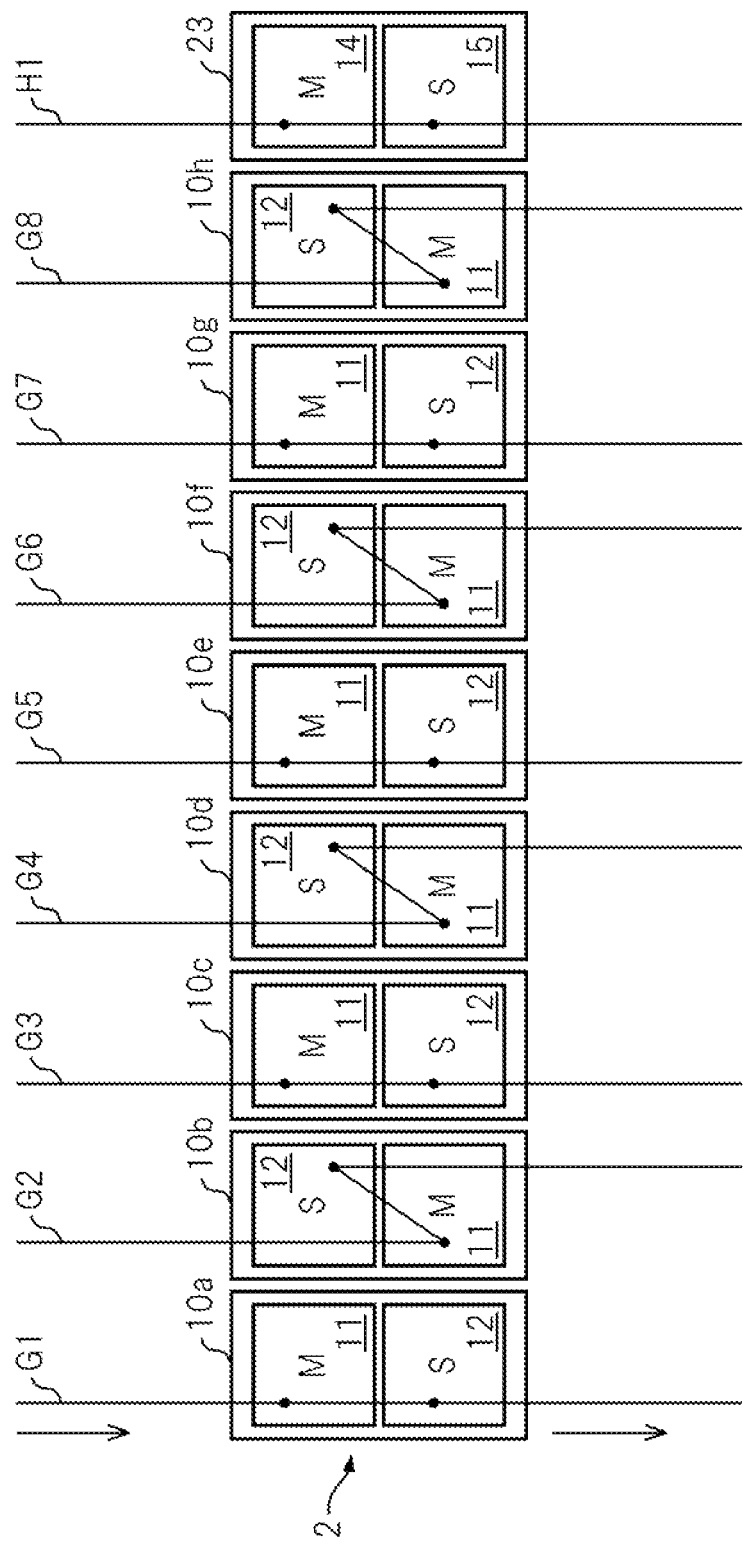
FIG. 2 is a diagram illustrating a flip-flop circuit set depicted in FIG. 1.

FIG. 1 is a diagram illustrating the first embodiment of the semiconductor device disclosed in this specification. FIG. 2 is a diagram illustrating a flip-flop circuit set depicted in FIG. 1.

The semiconductor device 1 of this embodiment includes a first combinational circuit 20, a flip-flop circuit set 2 which stores a data signal output from the first combinational circuit 20, and a second combinational circuit 21 which takes as input the data signal output from the flip-flop circuit set 2. A clock signal line not depicted is connected to each circuit.

An 8-bit data signal from eight data signal lines G1 to G8 is input to the first combinational circuit 20. The first combinational circuit 21 performs logic operations on the 8-bit input signal, and outputs the 8-bit data signal thus operated on, onto the signal lines G1 to G8 for input to the flip-flop circuit set 2.

The 8-bit data signal from the first combinational circuit 20 is thus input to the flip-flop circuit set 2. The flip-flop circuit set 2 holds the 8-bit data signal, adjusts its timing, and outputs the 8-bit data signal onto the signal lines G1 to G8 for input to the second combinational circuit 21.

The 8-bit data signal from the flip-flop circuit set 2 is thus input to the second combinational circuit 21. The second combinational circuit 21 performs logic operations on the 8-bit input signal, and supplies the 8-bit data signal thus operated on, onto the signal lines G1 to G8 for input to a circuit, etc. on the subsequent stage (not depicted).

The flip-flop circuit set 2 includes eight master-slave flip-flop circuits 10a to 10h. In the semiconductor device 1, one word is formed by 8-bit information. Hereinafter, the master-slave flip-flop circuits may also be referred to simply as the MS FF circuits.

To detect whether an error has occurred in one of the plurality of stored bits forming one word of information, the semiconductor device 1 includes a parity generating circuit 22, a parity master-slave flip-flop circuit 23, and an error determining circuit 24. Hereinafter, the parity master-slave flip-flop circuit may also be referred to simply as the PMS FF circuit.

The data signal bits output from the eight MS FF circuits 10a to 10h are also supplied to the parity generating circuit 22. Based on the bit information thus supplied, the parity generating circuit 22 generates a first parity signal, and supplies the generated first parity signal to the PMS FF circuit 23 via a parity signal line H1. The parity generating circuit 22 sets the first parity signal, for example, to "1" if the total number of is in the 8-bit signal is even, and to "0" if the total number is odd.

The PMS FF circuit 23 stores the received parity signal, and supplies the stored parity signal to the error determining circuit 24 via the parity signal line H1.

After the first parity signal has been set as described above, the data signal bits are again output from the eight MS FF circuits 10a to 10h and supplied to the parity generating circuit 22, which then generates a second parity signal. The parity generating circuit 22 supplies the generated second parity signal to the error determining circuit 24 via a parity signal line H2.

The error determining circuit 24 performs an exclusive-OR (XOR) operation between the first and second parity signals and determines whether the first and second parity signals are identical or not. If the first and second parity signals are not identical, the error determining circuit 24 generates an error flag and supplies it to the first combinational circuit 20 or to a host circuit such as a circuit located upstream of the first combinational circuit 20. The error determining circuit 24 outputs a data signal "0" if the first and second parity signals are identical, and an error flag data signal "1" if they are not identical.

The host circuit that received the error flag from the error determining circuit 24 outputs the data signal once again, and the 8-bit data signal output from the first combinational circuit 20 is again input to the flip-flop circuit set 2.

The semiconductor device 1 may form one word not by 8 bits but by some other number of bits. For example, one word may be formed, for example, by 4 bits, 16 bits, 32 bits, or 64 bits. In any case, the flip-flop circuit set 2 is constructed from as many MS FF circuits as the number of bits forming one word.

Next, the flip-flop circuit set 2 will be described in further detail below.

As illustrated in FIG. 2, the flip-flop circuit set 2 is constructed by arranging the eight MS FF circuits 10a to 10h in a direction that intersects at right angles to the direction of the data signal lines G1 to G8. The MS FF circuits 10a to 10h respectively include master latch (master storage) circuits 11 which receive and latch the respective data signal bits in synchronism with the same clock signal and slave latch (slave storage) circuits 12 which receive and latch the data signal bits from the respective master latch circuits 11 in synchronism with the same clock signal. The slave latch circuits 12 output the latched data signal bits onto the respective data signal lines G1 to G8.

The master latch circuit 11 and slave latch circuit 12 in each of the MS FF circuits 10a to 10h are disposed one adjacent to the other in a direction parallel to the data signal lines G1 to G8.

Then, the master latch circuit 11 of one MS FF circuit 10a is disposed adjacent to the slave latch circuit 12 of another MS FF circuit 10b. The slave latch circuit 12 of the one MS FF circuit 10a is disposed adjacent to the master latch circuit 11 of that other MS FF circuit 10b. The same arrangement is also employed for each of the other adjacent pairs of MS FF circuits.

In this way, the master latch circuit 11 of one MS FF circuit and the slave latch circuit 12 of another MS FF circuit adjacent to the one MS FF circuit are arranged in alternating fashion along the direction in which the eight MS FF circuits 10a to 10h are arranged.

The PMS FF circuit 23 is disposed side by side with the MS FF circuit 10h on a side thereof opposite from the MS FF circuit 10g. In FIG. 1, the MS FF circuit 10h and the PMS FF circuit 23 are depicted as if they were spaced some distance away from each other, because the data signal lines are depicted between the two circuits.

The PMS FF circuit 23 includes a parity master latch circuit 14 and a parity slave latch circuit 15. The first parity signal, generated based on the data signal bits latched in the respective slave latch circuits of the MS FF circuits 10a to 10h, is latched into the parity master latch circuit 14 in synchronism with a clock signal. The parity signal latched in the parity master latch circuit is latched into the parity slave latch circuit 15 in synchronism with a clock signal. The first parity signal thus latched in the parity slave latch circuit 15 is output on the first parity signal line H1.

The parity slave latch circuit 15 of the PMS FF circuit 23 is disposed adjacent to the master latch circuit 11 of the MS FF circuit 10h. The parity master latch circuit 14 of the PMS FF circuit 23 is disposed adjacent to the slave latch circuit 12 of the MS FF circuit 10h. That is, the PMS FF circuit 23 is substantially identical in structure and arrangement to each of the MS FF circuits forming the flip-flop circuit set 2.

Next, the operation of the MS FF circuit 10a as one of the MS FF circuits forming the flip-flop circuit set 2 will be described below with reference to a circuit diagram. Since the eight MS FF circuits 10a to 10h are identical in structure, the following description given of the MS FF circuit 10a also applies to the other MS FF circuits.

Figure 3:
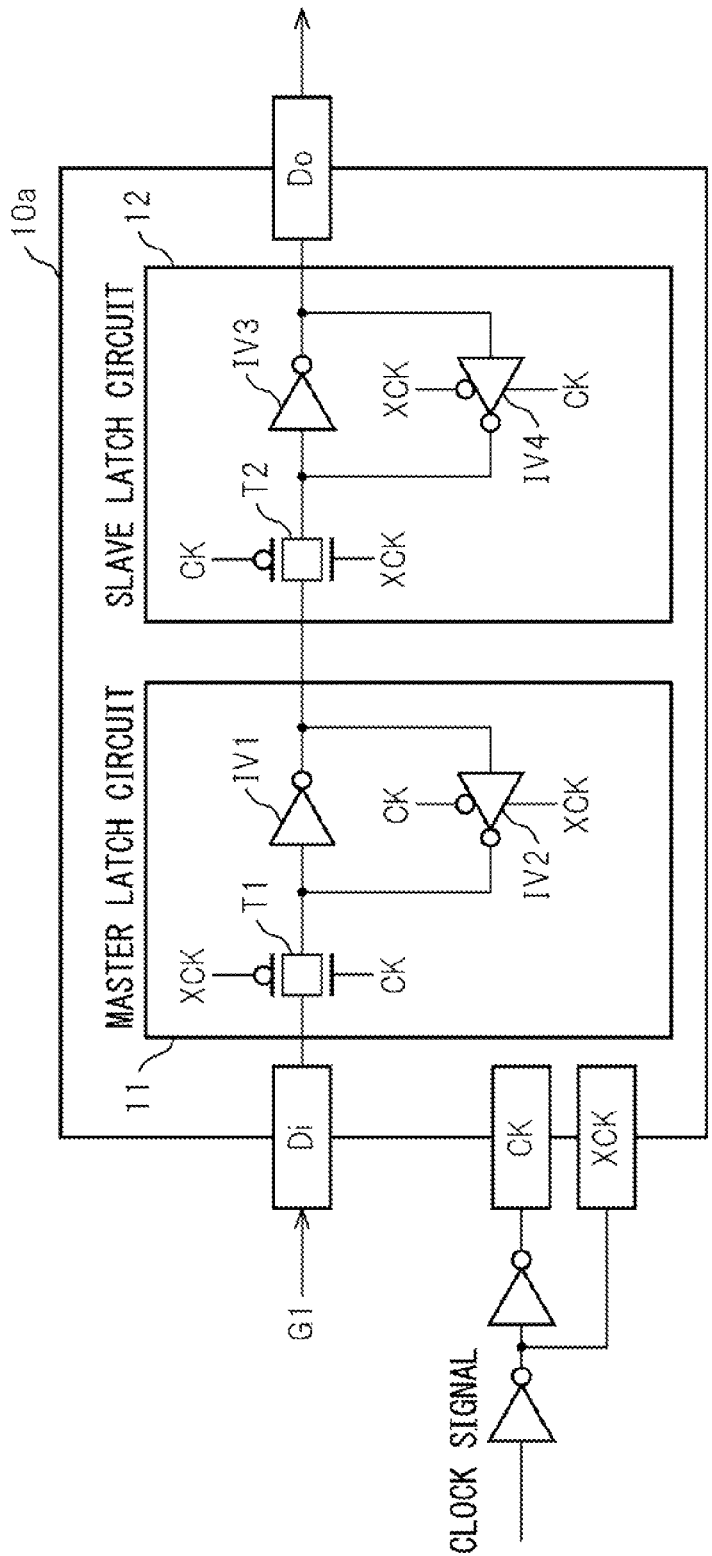
FIG. 3 is a circuit diagram of a master-slave flip-flop circuit depicted in FIG. 1.

FIG. 3 is a circuit diagram of the master-slave flip-flop circuit of FIG. 1.

The MS FF circuit 10a includes an input part Di at which the data signal from the data signal line G1 is input and an output part Do at which the stored data signal is output. The MS FF circuit 10a further includes a clock input part CK at which the clock signal is input and an inverted clock input part XCK at which an inverted version of the clock signal is input.

The master latch circuit 11 of the MS FF circuit 10a includes a transfer gate T1, an inverter IV1, and an inverter IV2. The transfer gate T1 is supplied with the clock signal from the clock input part CK and the inverted version of the clock signal from the inverted clock input part XCK, and is turned on when the clock signal is high. On the other hand, the inverter IV2 is supplied with the clock signal from the clock input part CK and the inverted version of the clock signal from the inverted clock input part XCK, and is turned on when the clock signal is low.

The slave latch circuit 12 of the MS FF circuit 10a includes a transfer gate T2, an inverter IV3, and an inverter IV4. The transfer gate T2 is supplied with the clock signal from the clock input part CK and the inverted version of the clock signal from the inverted clock input part XCK, and is turned on when the clock signal is low. On the other hand, the inverter IV4 is supplied with the clock signal from the clock input part CK and the inverted version of the clock signal from the inverted clock input part XCK, and is turned on when the clock signal is high.

Next, the operation of the MS FF circuit 10a will be described below.

First, when the clock signal is high, the transfer gate T1 and the inverter IV4 are ON, and the transfer gate T2 and the inverter IV2 are OFF.

The data signal from the input part Di is transferred via the ON transfer gate T1 to the inverter IV1 by which the logic state of the data signal is inverted, and the inverted data signal is transferred to the transfer gate T2 as well as to the inverter IV2. The data signal transferred to the transfer gate T2 is not further transferred because the transfer gate T2 is OFF. Likewise, the data signal transferred to the inverter IV2 is not further transferred because the inverter IV2 is OFF.

On the other hand, the output of the inverter IV4, which is produced by inverting the logic state by the ON inverter IV4, is transferred to the inverter IV3. That is, the data signal output from the inverter IV3 is retained by an inverter loop formed by the inverters IV3 and IV4. The output of the inverter IV3 is transferred to the output part Do for output as the data signal.

Next, when the clock signal is low, the transfer gate T2 and the inverter IV2 are ON, and the transfer gate T1 and the inverter IV4 are OFF.

The input of the data signal from the input part Di is shut off by the OFF transfer gate T1. However, since the inverter IV2 is ON, the output of the inverter IV2 is transferred to the inverter IV1. That is, the data signal output from the inverter IV1, that is, the input signal immediately before the clock signal changed to the low level, is retained by an inverter loop formed by the inverters IV1 and IV2. The output of the inverter IV1 is also transferred to the transfer gate T2.

The data signal output from the inverter IV1 is transferred via the ON transfer gate T2 to the inverter IV3 by which the logic state of the data signal is inverted, and the inverted data signal is transferred to the output part Do as well as to the inverter IV4. The data signal transferred to the output part Do is output on the data signal line G1. On the other hand, the data signal transferred to the inverter IV4 is not further transferred because the inverter IV4 is OFF.

In the flop-flop circuit set 2 of the semiconductor device 1, if the data signal bits held in an even number of inverter loops are destroyed simultaneously due to soft errors, etc., it is not possible to detect the occurrence of the errors by using the one-bit parity signal.

The probability of the data signal bits held in an even number of inverter loops being destroyed simultaneously due to soft errors is highest, among others, in the case of the inverter loops in adjacent two MS FF circuits.

The soft error is a phenomenon in which electron-hole pairs are generated by energetic particles such as α-particles or neutrons impinging on circuit elements and the bit information is destroyed by the generated carriers; therefore, such a soft error may occur simultaneously in two inverter loops physically located close to each other.

Figure 4:
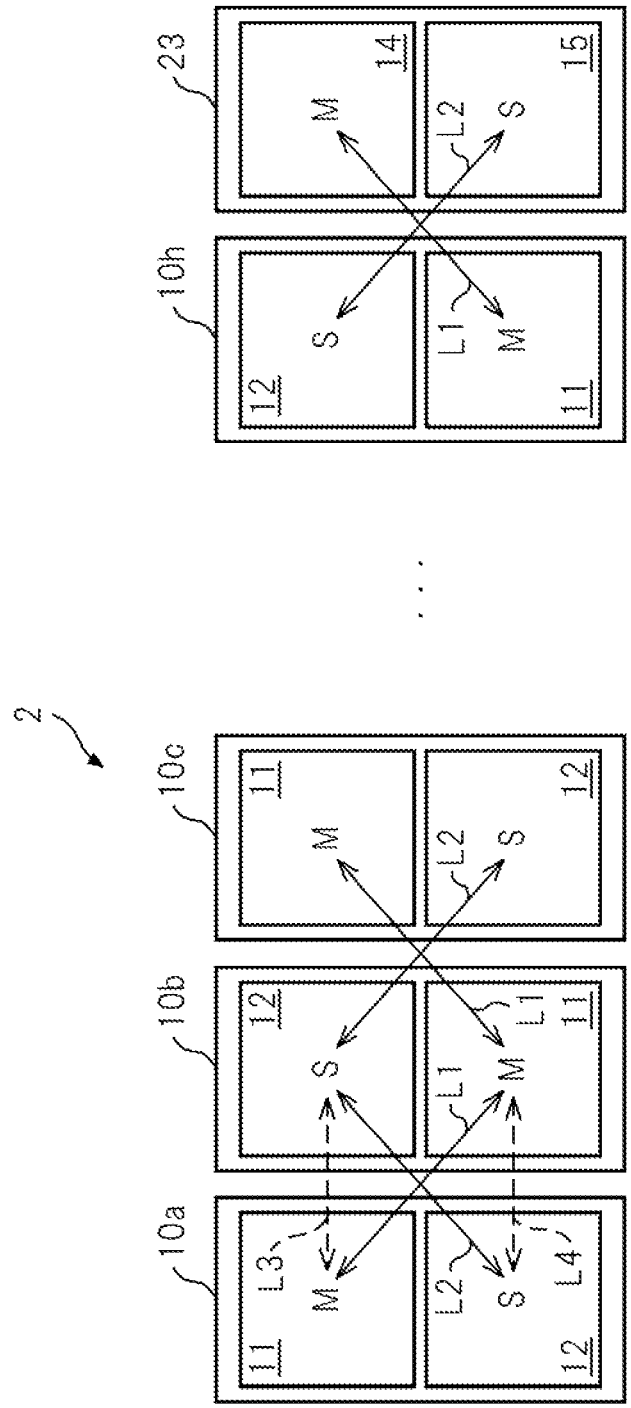
FIG. 4 is a diagram illustrating the distance between master latch circuits and the distance between slave latch circuits in adjacent master-slave flip-flop circuits.

FIG. 4 is a diagram illustrating the distance between the master latch circuits and the distance between the slave latch circuits in adjacent master-slave flip-flop circuits.

In the flip-flop circuit set 2, the distance L1 between the master latch circuits 11 of the adjacent MS FF circuits 10a and 10b is greater than the distance L3 between the master latch circuits of the prior art. In the prior art, the master latch circuits were disposed so as to be adjacent to each other.

Accordingly, in the flip-flop circuit set 2, the data signal bits held in the inverter loops formed in the master latch circuits 11 of the two adjacent MS FF circuits 10a and 10b are prevented from being destroyed simultaneously due to soft errors, etc.

Likewise, in the flip-flop circuit set 2, the distance L2 between the slave latch circuits 12 of the adjacent MS FF circuits 10a and 10b is greater than the distance L4 between the slave latch circuits of the prior art. In the prior art, the slave latch circuits were disposed so as to be adjacent to each other.

Accordingly, in the flip-flop circuit set 2, the data signal bits held in the inverter loops formed in the slave latch circuits 12 of the two adjacent MS FF circuits 10a and 10b are prevented from being destroyed simultaneously due to soft errors, etc.

In this way, in the flip-flop circuit set 2 of the semiconductor device 1, the data signal bits held in the inverter loops formed in any two adjacent MS FF circuits are prevented from being destroyed simultaneously due to soft errors, etc.

Further, in the flip-flop circuit set 2 of the semiconductor device 1, since the master latch circuit and the slave latch circuit are just interchanged in position between the adjacent MS FF circuits, the area that each MS FF circuit occupies does not increase compared with the prior art arrangement.

In the flip-flop circuit set 2, the distance between the master latch circuit 11 of one MS FF circuit 10a and the slave latch circuit 12 of its adjacent MS FF circuit 10b is the same as the distance between the master latch circuits of the prior art. Accordingly, the probability of soft errors occurring simultaneously in the master latch circuit 11 and the slave latch circuit 12 between the adjacent MS FF circuits 10a and 10b is about the same as that in the prior art flip-flop circuit set.

However, at any given time, the inverter loop for holding the data signal is formed only in either the master latch circuit 11 or the slave latch circuit 12 in the adjacent MS FF circuits 10a and 10b, depending on the high/low level of the clock signal. If a soft error occurs in an inverter that does not form the inverter loop for holding the data signal, since the data signal continues to be transferred to that inverter, only noise occurs at the output. Accordingly, if soft errors occur simultaneously in the master latch circuit 11 and the slave latch circuit 12 in the adjacent MS FF circuits 10a and 10b, a two-bit error does not occur in the stored information.

Since the eight MS FF circuits 10a to 10h forming the flip-flop circuit set 2 are identical in structure, the above description given of the MS FF circuits 10a and 10b also applies to the other adjacent pairs of MS FF circuits.

Further, in the semiconductor device 1, since the PMS FF circuit 23 is substantially identical in structure to each of the MS FF circuits 10a to 10h, the above description given of the MS FF circuits 10a and 10b also applies to the PMS FF circuit 23 and its adjacent MS FF circuit 10h.

According to the semiconductor device 1 of the present embodiment described above, it becomes possible, without increasing the device area, to prevent errors from occurring simultaneously in an even number of bits among the plurality of stored bits.

It is preferable that the flip-flop circuit set 2 of the semiconductor device 1 according to the present embodiment is mounted in an apparatus in which it is particularly desired to prevent the occurrence of soft errors. Examples of such apparatus include those mounted in aircraft, artificial satellites, etc. that navigate at high altitude where they are highly likely to be affected by cosmic rays. Examples of such apparatus further include medical equipment or transport vehicles such as motor vehicles that can jeopardize human lives if an accident occurs due to soft errors. Examples of such apparatus also include servers that handle large amounts of data signals and that can cause serious problems if soft errors occur.

Next, a modified example of the semiconductor device 1 of the foregoing first embodiment will be described below.

Figure 5:
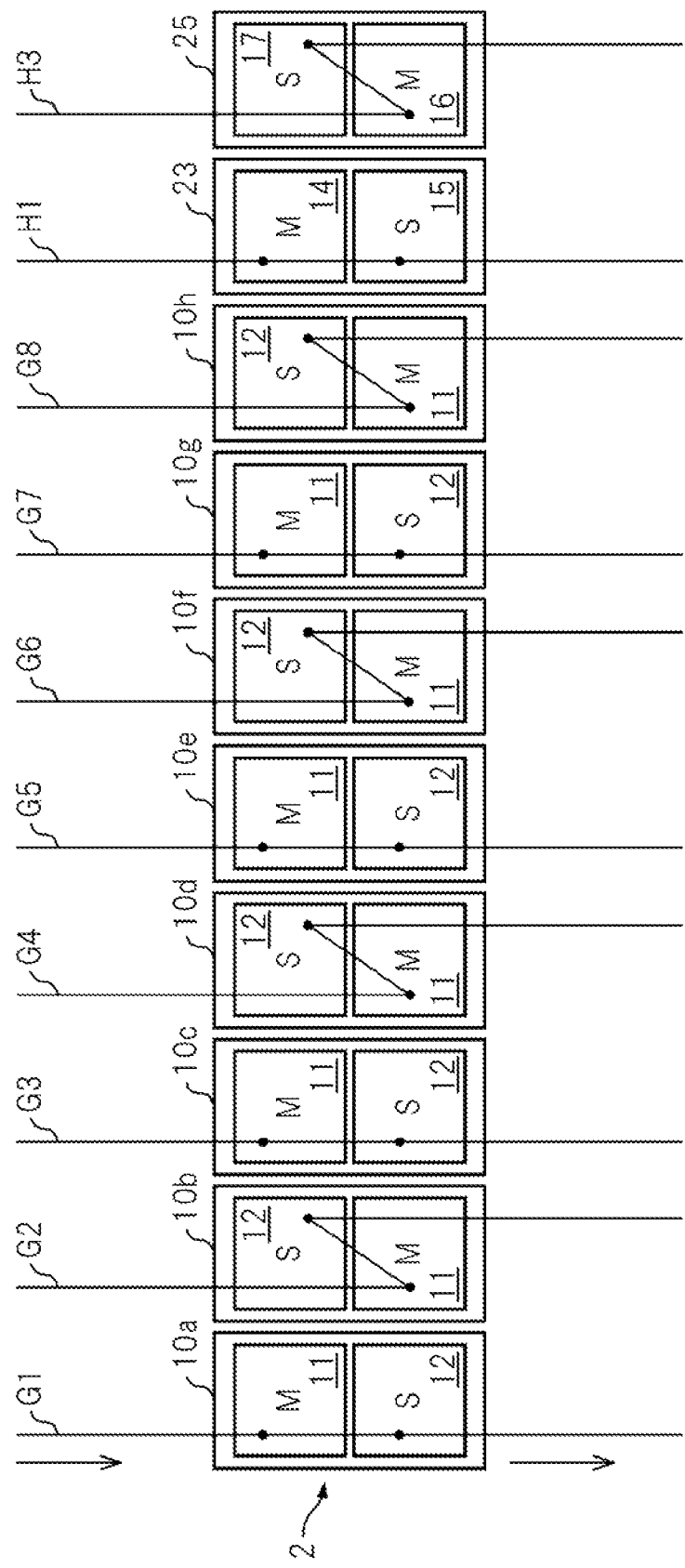
FIG. 5 is a diagram illustrating a modified example of the first embodiment of the semiconductor device disclosed in this specification.

FIG. 5 is a diagram illustrating a modified example of the first embodiment of the semiconductor device disclosed in this specification.

The modified example illustrated in FIG. 5 includes a parity correction master-slave flip-flip circuit 25 which is disposed adjacent to the PMS FF circuit 23. Hereinafter, the parity correction master-slave flip-flop circuit may also be referred to simply as the PCMS FF circuit.

The PCMS FF circuit 25 stores parity correction information which is used, together with the first parity information stored in the PMS FF circuit 23, to correct bit information when an error flag is output from the error determining circuit 24. The parity correction information is input to the PCMS FF circuit 25 via a parity signal line H3.

Similarly to the MS FF circuits 10a to 10h and the PMS FF circuit 23, the PCMS FF circuit 25 includes a master latch circuit 16 and a slave latch circuit 17. The PCMS FF circuit 25 is disposed adjacent to the PMS FF circuit 23 on a side thereof opposite from the MS FF circuit 10h. The master latch circuit 16 of the PCMS FF circuit 25 is disposed adjacent to the slave latch circuit 15 of the PMS FF circuit 23. The slave latch circuit 17 of the PCMS FF circuit 25 is disposed adjacent to the master latch circuit 14 of the PMS FF circuit 23.

Next, alternative embodiments of the above semiconductor device will be described below with reference to FIGS. 6 to 12. In all aspects not specifically described otherwise, the detailed description given of the foregoing first embodiment also applies to the alternative embodiments.

[b] Second Embodiment

Figure 6:
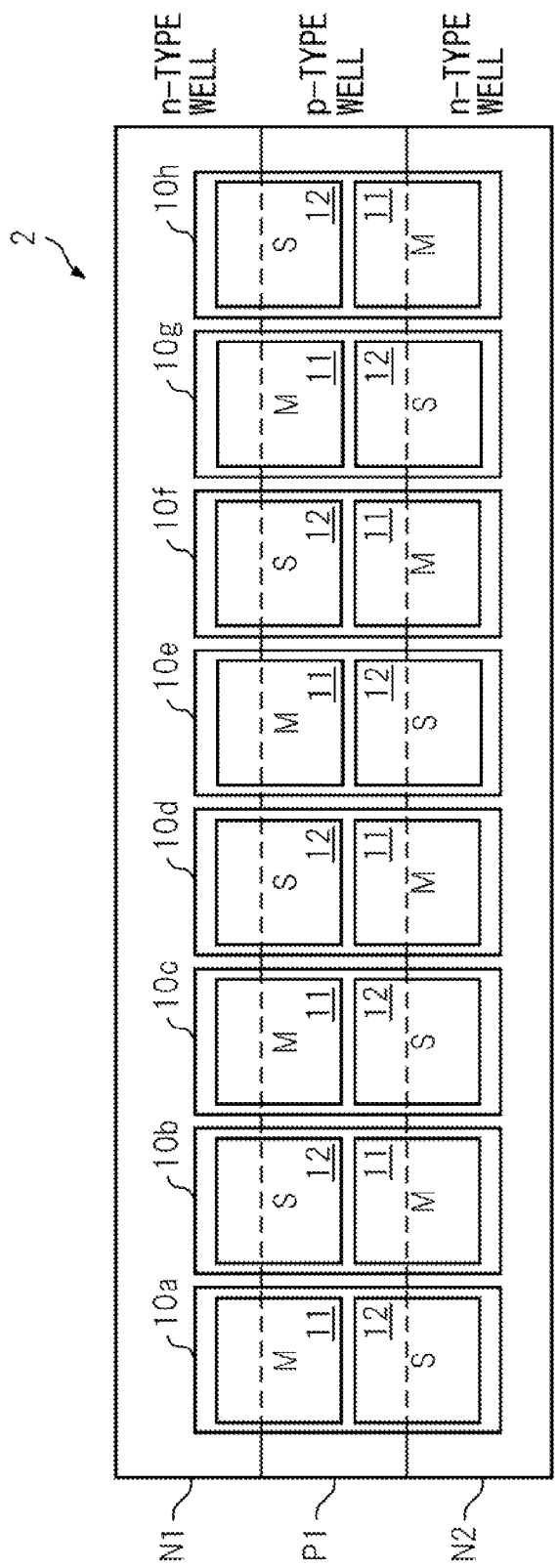
FIG. 6 is a diagram illustrating a second embodiment of the semiconductor device disclosed in this specification.

FIG. 6 is a diagram illustrating a second embodiment of the semiconductor device disclosed in this specification.

In the flip-flop circuit set 2 of the semiconductor device according to this embodiment, the MS FF circuits 10a to 10h are formed in n-type wells N1 and N2 of one conductivity type and a p-type well P1 of the opposite conductivity type.

The n-type wells N1 and N2 and the p-type well P1 are formed so as to extend in strips, the p-type well P1 being formed between the n-type wells N1 and N2. The master latch circuits 11 and the slave latch circuits 12 of the MS FF circuits 10a to 10h are each formed so as to cross the boundary between the n-type well and the p-type well.

As illustrated in FIG. 6, in each of the MS FF circuits 10a to 10h, the master latch circuit 11 and the slave latch circuit 12 are disposed one adjacent to the other in a direction that intersects the direction along which the n-type wells N1 and N2 and the p-type well P1 extend. More specifically, in the present embodiment, the direction in which the master latch circuit 11 and the slave latch circuit 12 are arranged intersects at right angles to the direction along which the n-type wells N1 and N2 and the p-type well P1 extend.

Figure 7:
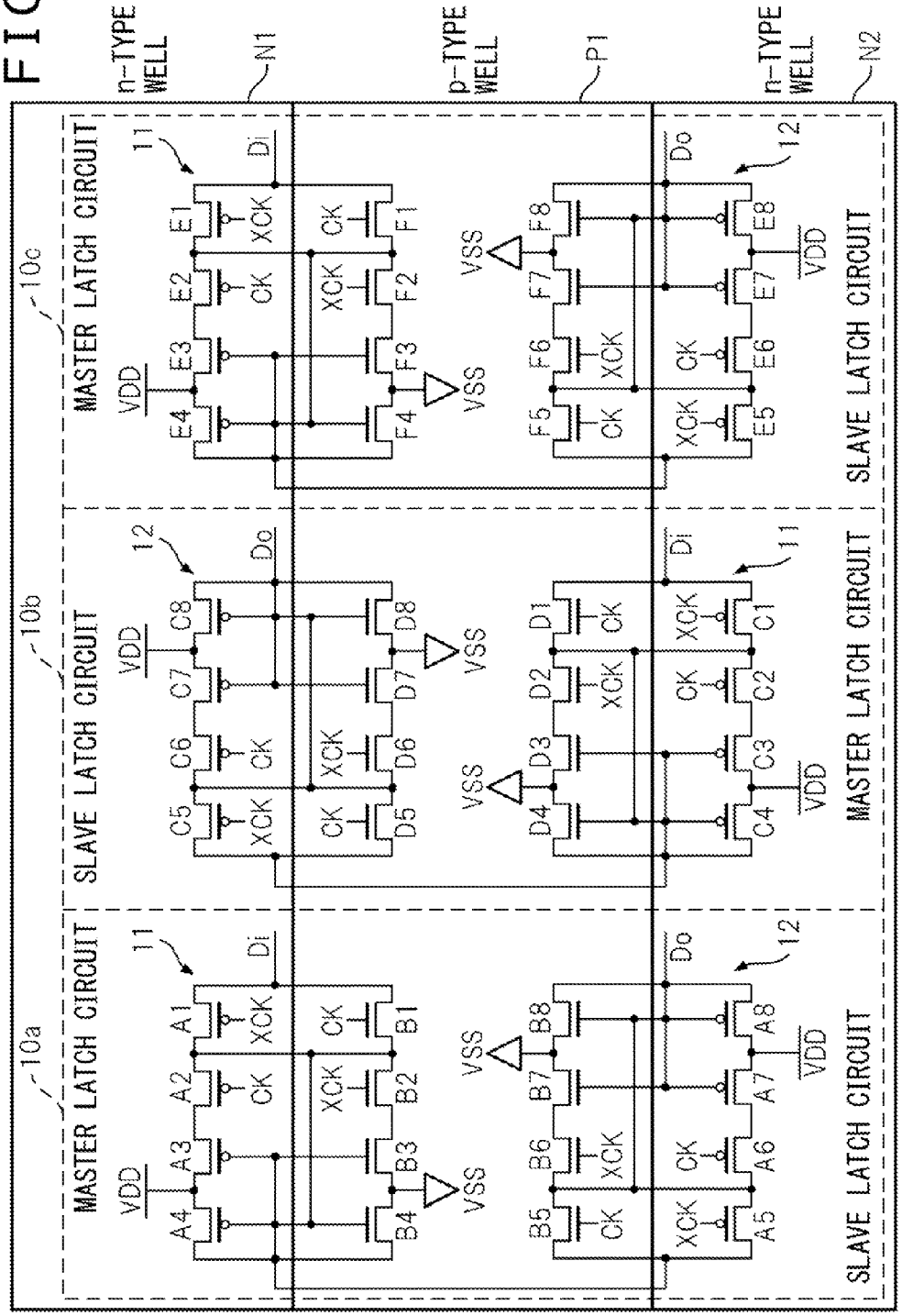
FIG. 7 is a circuit diagram of master-slave flip-flop circuits depicted in FIG. 6.

FIG. 7 is a circuit diagram of the master-slave flip-flop circuits of FIG. 6.

In FIG. 7, only the MS FF circuits 10a to 10c in the flip-flop circuit set 2 are depicted. Further, in FIG. 7, some of the wiring lines, etc. are omitted.

In the master latch circuit 11 of the MS FF circuit 10a, the transfer gate T1 depicted in FIG. 3 is constructed from a combination of a p-type MOS transistor A1 and an n-type MOS transistor B1. The inverter IV1 depicted in FIG. 3 is constructed from a combination of a p-type MOS transistor A4 and an n-type MOS transistor B4. The inverter IV2 depicted in FIG. 3 is constructed from a combination of p-type MOS transistors A2 and A3 and n-type MOS transistors B2 and B3.

Further, in the slave latch circuit 12 of the MS FF circuit 10a, the transfer gate T2 depicted in FIG. 3 is constructed from a combination of a p-type MOS transistor A5 and an n-type MOS transistor B5. The inverter IV3 depicted in FIG. 3 is constructed from a combination of a p-type MOS transistor A8 and an n-type MOS transistor B8. The inverter IV4 depicted in FIG. 3 is constructed from a combination of p-type MOS transistors A6 and A7 and n-type MOS transistors B6 and B7.

Since the MS FF circuits 10a to 10h are identical in structure, the above description given of the MS FF circuit 10a also applies to the other MS FF circuits 10b to 10h.

As illustrated in FIG. 7, in the flip-flop circuit set 2, the p-type MOS transistors A1 to A4 of one conductivity type, included in the master latch circuit 11 of the MS FF circuit 10a, are formed in the n-type well N1. The p-type MOS transistors C1 to C4 included in the master latch circuit 11 of the MS FF circuit 10b adjacent to the MS FF circuit 10a are formed in the other n-type well N2. That is, the array of p-type MOS transistors A1 to A4 included in the master latch circuit 11 of the MS FF circuit 10a and the array of p-type MOS transistors C1 to C4 included in the master latch circuit 11 of the MS FF circuit 10b are respectively formed in different n-type wells. This arrangement also applies to the next adjacent pair of MS FF circuits 10b and 10c. The same arrangement is also employed for each of the other adjacent pairs of MS FF circuits.

In this way, in the flip-flop circuit set 2 of the present embodiment, the p-type MOS transistor arrays in the master latch circuits of any two adjacent MS FF circuits are respectively formed in different n-type wells.

On the other hand, the p-type MOS transistors A5 to A8 included in the slave latch circuit 12 of the MS FF circuit 10a are formed in the n-type well N2. The p-type MOS transistors C5 to C8 included in the slave latch circuit 12 of the MS FF circuit 10b adjacent to the MS FF circuit 10a are formed in the other n-type well Ni. That is, the array of p-type MOS transistors A5 to A8 included in the slave latch circuit 12 of the MS FF circuit 10a and the array of p-type MOS transistors C5 to C8 included in the slave latch circuit 12 of the MS FF circuit 10b are respectively formed in different n-type wells. This arrangement also applies to the next adjacent pair of MS FF circuits 10b and 10c. The same arrangement is also employed for each of the other adjacent pairs of MS FF circuits.

As described above, in the present embodiment, the array of p-type MOS transistors A1 to A4 included in the master latch circuit 11 of the MS FF circuit 10a and the array of p-type MOS transistors C1 to C4 included in the master latch circuit 11 of the MS FF circuit 10b adjacent to the MS FF circuit 10a are respectively formed in different n-type wells; this arrangement serves to prevent the occurrence of soft errors due to a parasitic bipolar effect. A parasitic bipolar effect is a phenomenon in which when soft errors occur in the p-type MOS transistors A1 to A4 included in the master latch circuit 11 of the MS FF circuit 10a, and electron-hole pairs are generated, the generated carries affect other devices such as transistors formed in the same well. For example, due to the parasitic bipolar effect, an OFF transistor may turn on.

In this way, in the flip-flop circuit set 2 of the present embodiment, since the p-type MOS transistor arrays in the master latch circuits of any two adjacent MS FF circuits are respectively formed in different n-type wells, soft errors can be prevented from occurring due to the parasitic bipolar effect.

Similarly, since the array of p-type MOS transistors A5 to A8 included in the slave latch circuit 12 of the MS FF circuit 10a and the array of p-type MOS transistors C5 to C8 included in the slave latch circuit 12 of the MS FF circuit 10b are respectively formed in different n-type wells, soft errors can be prevented from occurring simultaneously due to the parasitic bipolar effect.

In this way, in the flip-flop circuit set 2 of the present embodiment, since the p-type MOS transistor arrays in the slave latch circuits of any two adjacent MS FF circuits are respectively formed in different n-type wells, soft errors can be prevented from occurring simultaneously due to the parasitic bipolar effect.

On the other hand, the array of p-type MOS transistors A1 to A4 included in the master latch circuit 11 of the MS FF circuit 10a and the array of p-type MOS transistors C5 to C8 included in the slave latch circuit 12 of the MS FF circuit 10b are formed in the same n-type well N1.

Likewise, the array of p-type MOS transistors A5 to A8 included in the slave latch circuit 12 of the MS FF circuit 10a and the array of p-type MOS transistors C1 to C4 included in the master latch circuit 11 of the MS FF circuit 10b are formed in the same n-type well N2.

Further, the array of p-type MOS transistors A1 to A4 included in the master latch circuit 11 of the MS FF circuit 10a and the array of p-type MOS transistors E1 to E4 included in the master latch circuit 11 of the MS FF circuit 10c are formed in the same n-type well N1. Likewise, the array of p-type MOS transistors A5 to A8 included in the slave latch circuit 12 of the MS FF circuit 10a and the array of p-type MOS transistors E5 to E8 included in the slave latch circuit 12 of the MS FF circuit 10c are formed in the same n-type well N2.

The array of n-type MOS transistors B1 to B4 included in the master latch circuit 11 of the MS FF circuit 10a, the array of n-type MOS transistors D1 to D4 included in the master latch circuit 11 of the MS FF circuit 10b, and the array of n-type MOS transistors F1 to F4 included in the master latch circuit 11 of the MS FF circuit 10c are formed in the same p-type well P1. Further, the array of n-type MOS transistors B5 to B8 included in the slave latch circuit 12 of the MS FF circuit 10a, the array of n-type MOS transistors D5 to D8 included in the slave latch circuit 12 of the MS FF circuit 10b, and the array of n-type MOS transistors F5 to F8 included in the slave latch circuit 12 of the MS FF circuit 10c are formed in the same p-type well P1. That is, in the present embodiment, all the n-type MOS transistors are formed in the same p-type well P1.

As described above, the array of p-type MOS transistors A1 to A4 included in the master latch circuit 11 of the MS FF circuit 10a and the array of p-type MOS transistors E1 to E4 included in the master latch circuit 11 of the MS FF circuit 10c are formed in the same n-type well N1. However, since the MS FF circuits 10a and 10c are spaced some distance away from each other, soft errors can be prevented from occurring simultaneously.

Similarly, the array of p-type MOS transistors A5 to A8 included in the slave latch circuit 12 of the MS FF circuit 10a and the array of p-type MOS transistors E5 to E8 included in the slave latch circuit 12 of the MS FF circuit 10c are formed in the same n-type well N2. However, since the MS FF circuits 10a and 10c are spaced some distance away from each other, soft errors can be prevented from occurring simultaneously.

Except for the structure of the flip-flop circuit set 2, the semiconductor device of the present embodiment is substantially identical to the semiconductor device of the foregoing first embodiment.

According to the semiconductor device of the present embodiment described above, it also becomes possible to prevent errors from occurring simultaneously due to the parasitic bipolar effect in an even number of bits among the plurality of stored bits. The present embodiment also offers the same effect as that achieved in the first embodiment.

[c] Third Embodiment

Figure 8:
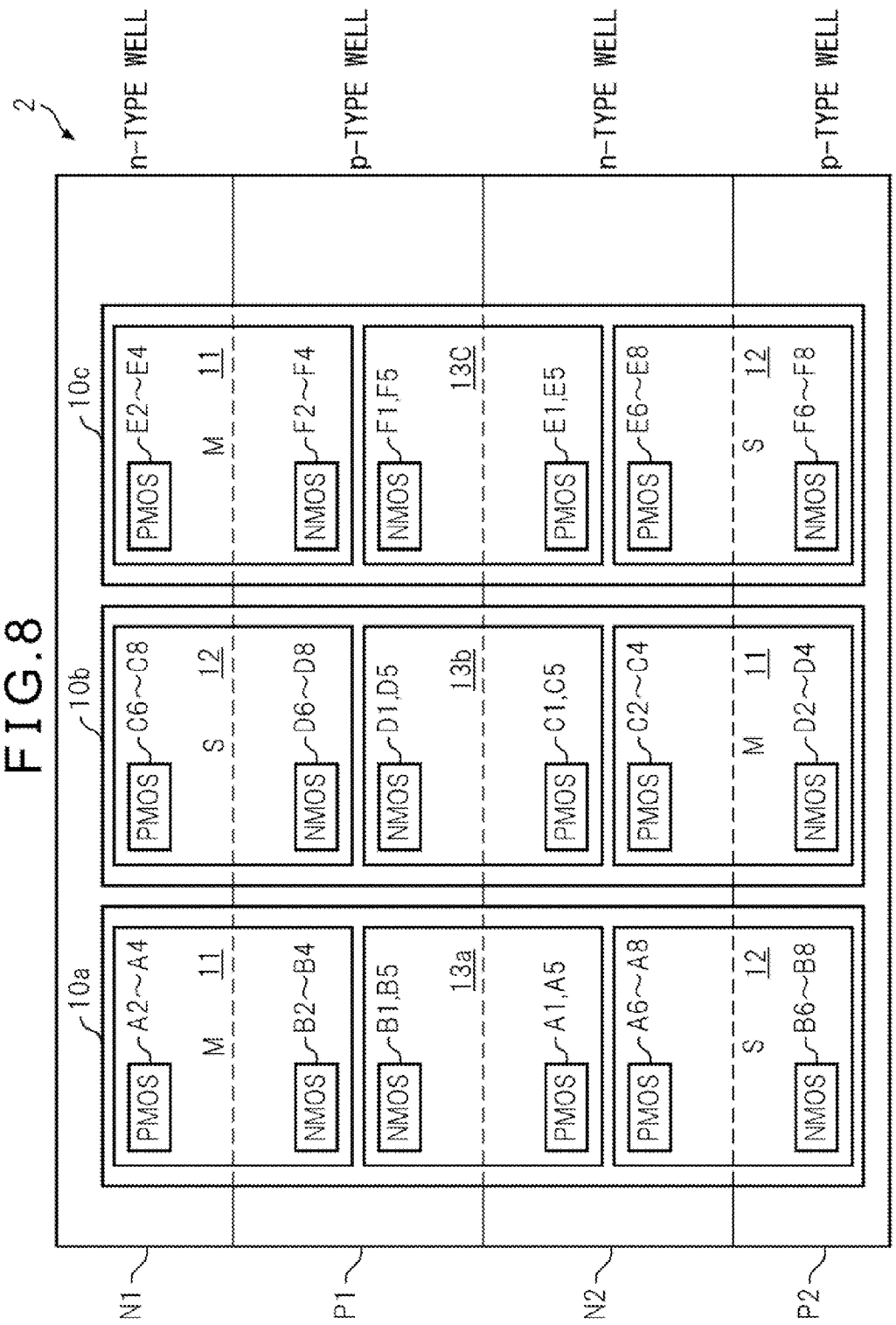
FIG. 8 is a diagram illustrating a third embodiment of the semiconductor device disclosed in this specification.

FIG. 8 is a diagram illustrating a third embodiment of the semiconductor device disclosed in this specification. In FIG. 8, only the MS FF circuits 10a to 10c in the flip-flop circuit set 2 are depicted. Since the MS FF circuits 10a to 10c are identical in structure to the MS FF circuits 10d to 10h, the following description given of the MS FF circuits 10a to 10c also applies to the MS FF circuits 10d to 10h.

In the flip-flop circuit set 2 of the semiconductor device according to the present embodiment, a buffer circuit 13 is interposed between the master latch circuit 11 and the slave latch circuit 12 in each of the MS FF circuits 10a to 10c.

The MS FF circuits 10a to 10c are formed in n-type wells N1 and N2 and p-type wells P1 and P2. The n-type wells N1 and N2 and the p-type wells P1 and P2 are formed so as to extend in strips, the p-type well P1 being formed between the n-type wells N1 and N2. The n-type well N2 is formed between the p-type wells P1 and P2.

The master latch circuits 11 and the slave latch circuits 12 of the MS FF circuits 10a to 10c are each formed so as to cross the boundary between the n-type well and the p-type well.

The buffer circuit 13a is formed so as to cross the boundary between the p-type well P1 and the n-type well N2.

In the MS FF circuit 10a, the transistors that do not form the inverter loops in the master latch circuit 11 and the slave latch circuit 12 are disposed within the buffer circuit 13a. That is, the p-type MOS transistor A1 and the n-type MOS transistor B1, which together form the transfer gate T1 in the master latch circuit 11 of the MS FF circuit 10a, are disposed within the buffer circuit 13a. Further, the p-type MOS transistor A5 and the n-type MOS transistor B5, which together form the transfer gate T2 in the slave latch circuit 12 of the MS FF circuit 10a, are disposed within the buffer circuit 13a.

Likewise, in the MS FF circuit 10b, the transistors that do not form the inverter loops in the master latch circuit 11 and the slave latch circuit 12 are disposed within the buffer circuit 13b. Further, in the MS FF circuit 10c, the transistors that do not form the inverter loops in the master latch circuit 11 and the slave latch circuit 12 are disposed within the buffer circuit 13c.

In the buffer circuit 13a of the MS FF circuit 10a, the p-type MOS transistors A1 and A5 are together designated in abbreviated form as PMOS within a rectangular frame, and the n-type MOS transistors B1 and B5 are together designated in abbreviated form as NMOS within a rectangular frame. The same abbreviated transistor designations are also employed for the other buffer circuits.

In this way, in each of the MS FF circuits 10a to 10c, the transistors that do not form the inverter loops in the master latch circuit 11 and the slave latch circuit 12 are arranged between the transistors that form the respective inverter loops. This arrangement serves to further increase the distance between the respective mater latch circuits 11 and the distance between the respective slave latch circuits 12 in the adjacent MS FF circuits 10 and 10b. The same arrangement is also employed for each of the other adjacent pairs of MS FF circuits.

In the master latch circuit 11 of the MS FF circuit 10a, the p-type MOS transistors A2 to A4 are together designated in abbreviated form as PMOS within a rectangular frame, and the n-type MOS transistors B2 to B4 are together designated in abbreviated form as NMOS within a rectangular frame. Further, in the slave latch circuit 12 of the MS FF circuit 10a, the p-type MOS transistors A6 to A8 are together designated in abbreviated form as PMOS within a rectangular frame, and the n-type MOS transistors B6 to B8 are together designated in abbreviated form as NMOS within a rectangular frame. The same abbreviated transistor designations are also employed for the other MS FF circuits 10b and 10c.

The array of n-type MOS transistors B2 to B4 included in the master latch circuit 11 of the MS FF circuit 10a is formed in the p-type well P1. The array of n-type MOS transistors D2 to D4 included in the master latch circuit 11 of the MS FF circuit 10b adjacent to the MS FF circuit 10a is formed in the other p-type well P2. That is, the array of n-type MOS transistors B2 to B4 included in the master latch circuit 11 of the MS FF circuit 10a and the array of n-type MOS transistors D2 to D4 included in the master latch circuit 11 of the MS FF circuit 10b are respectively formed in different p-type wells. This arrangement also applies to the next adjacent pair of MS FF circuits 10b and 10c. The same arrangement is also employed for each of the other adjacent pairs of MS FF circuits.

The array of n-type MOS transistors B6 to B8 included in the slave latch circuit 12 of the MS FF circuit 10a is formed in the p-type well P2. The array of n-type MOS transistors D6 to D8 included in the slave latch circuit 12 of the MS FF circuit 10b is formed in the other p-type well P1. That is, the array of n-type MOS transistors B6 to B8 included in the slave latch circuit 12 of the MS FF circuit 10a and the array of n-type type MOS transistors D6 to D8 included in the slave latch circuit 12 of the MS FF circuit 10b are respectively formed in different p-type wells. This arrangement also applies to the next adjacent pair of MS FF circuits 10b and 10c. The same arrangement is also employed for each of the other adjacent pairs of MS FF circuits.

The array of n-type MOS transistors B2 to B4 included in the master latch circuit 11 of the MS FF circuit 10a and the array of n-type MOS transistors D6 to D8 included in the slave latch circuit 12 of the MS FF circuit 10b are formed in the same p-type well P1. This arrangement also applies to the next adjacent pair of MS FF circuits 10b and 10c. The same arrangement is also employed for each of the other adjacent pairs of MS FF circuits.

On the other hand, the array of n-type MOS transistors B6 to B8 included in the slave latch circuit 12 of the MS FF circuit 10a and the array of n-type MOS transistors D2 to D4 included in the master latch circuit 11 of the MS FF circuit 10b are formed in the same p-type well P2. This arrangement also applies to the next adjacent pair of MS FF circuits 10b and 10c. The same arrangement is also employed for each of the other adjacent pairs of MS FF circuits.

In the present embodiment, the array of n-type MOS transistors B2 to B4 included in the master latch circuit 11 of the MS FF circuit 10a and the array of n-type MOS transistors D2 to D4 included in the master latch circuit 11 of the MS FF circuit 10b adjacent to the MS FF circuit 10a are respectively formed in different p-type wells. That is, in the flip-flop circuit set 2 of the present embodiment, the n-type MOS transistor arrays forming the inverter loops in the respective master latch circuits of the two adjacent MS FF circuits are formed in different p-type wells. Accordingly, in the present embodiment, it also becomes possible to prevent soft errors from occurring due to the parasitic bipolar effect in the n-type MOS transistors forming the inverter loop in each master latch circuit.

Similarly, the array of n-type MOS transistors B6 to B8 included in the slave latch circuit 12 of the MS FF circuit 10a and the array of n-type MOS transistors D6 to D8 included in the slave latch circuit 12 of the MS FF circuit 10b adjacent to the MS FF circuit 10a are respectively formed in different p-type wells. That is, in the flip-flop circuit set 2 of the present embodiment, the n-type MOS transistor arrays forming the inverter loops in the respective slave latch circuits of the two adjacent MS FF circuits are formed in different p-type wells. Accordingly, in the present embodiment, it also becomes possible to prevent soft errors from occurring due to the parasitic bipolar effect in the n-type MOS transistors forming the inverter loop in each slave latch circuit.

Further, in the present embodiment, as in the foregoing second embodiment, the p-type MOS transistor arrays forming the inverter loops in the respective master latch circuits of the two adjacent MS FF circuits are formed in different n-type wells. Similarly, the p-type MOS transistor arrays forming the inverter loops in the respective slave latch circuits of the two adjacent MS FF circuits are formed in different n-type wells.

Except for the difference in structure described above, the present embodiment is substantially the same as the foregoing second embodiment.

According to the semiconductor device of the present embodiment described above, it becomes possible to prevent errors from occurring simultaneously due to the parasitic bipolar effect in an even number of bits among the plurality of stored bits. The present embodiment also offers the same effect as that achieved in the second embodiment.

In the above embodiment, the buffer circuit 13 has been formed between the master latch circuit 11 and the slave latch circuit 12, but a circuit other than the buffer circuit may be disposed between the master latch circuit 11 and the slave latch circuit 12.

Next, first to fourth modified examples of the semiconductor device of the third embodiment will be described below.

Figure 9:
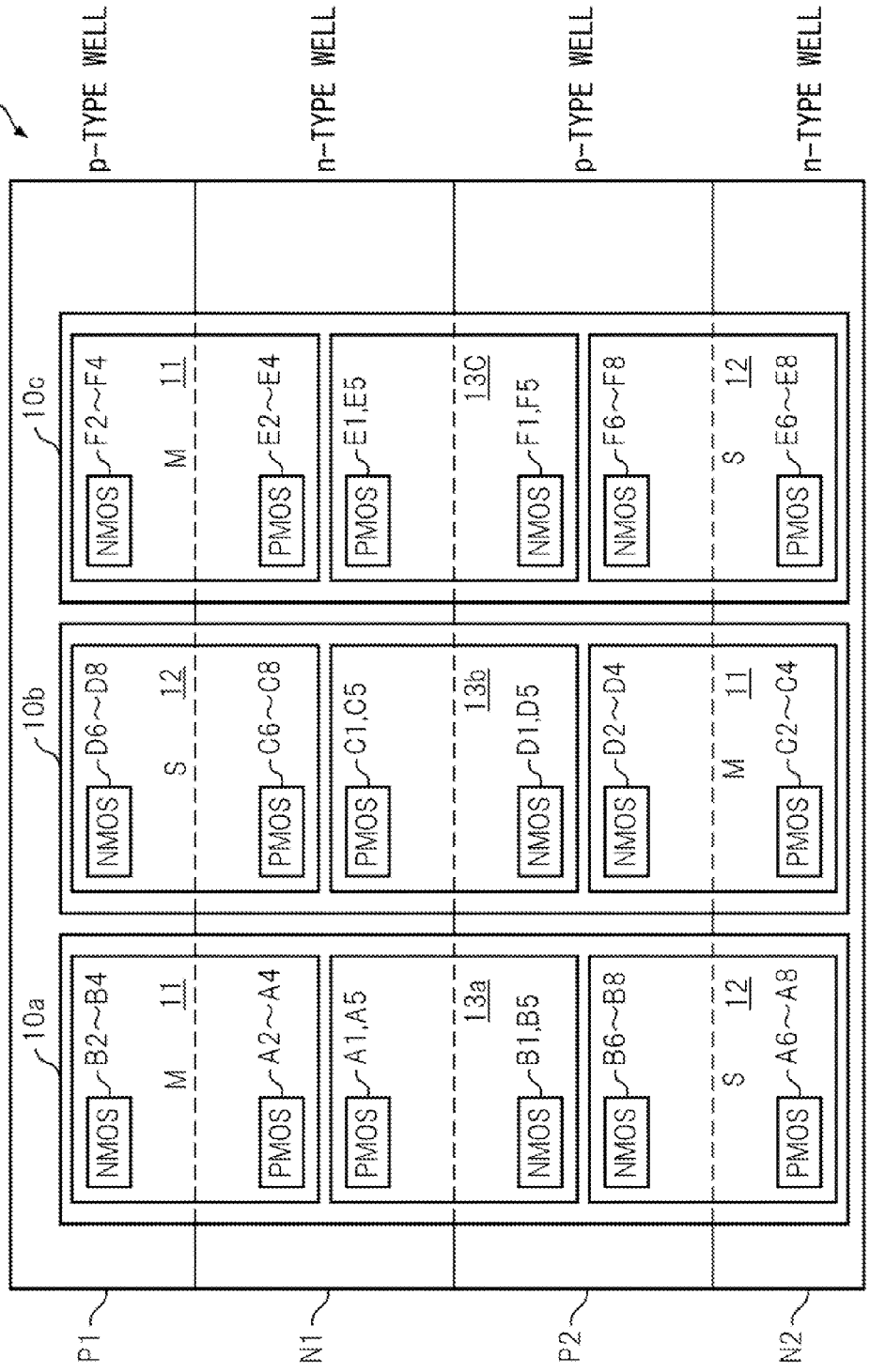
FIG. 9 is a diagram illustrating a first modified example of the third embodiment of the semiconductor device disclosed in this specification.

FIG. 9 is a diagram illustrating the first modified example of the third embodiment of the semiconductor device disclosed in this specification.

In this modified example, the arrangement of the n-type wells N1 and N2 and p-type wells P1 and P2 is different from that of the third embodiment depicted in FIG. 8. That is, the n-type well N1 is formed between the p-type well P1 and the p-type well P2. The p-type well P2 is formed between the n-type well N1 and the n-type well N2.

Figure 10:
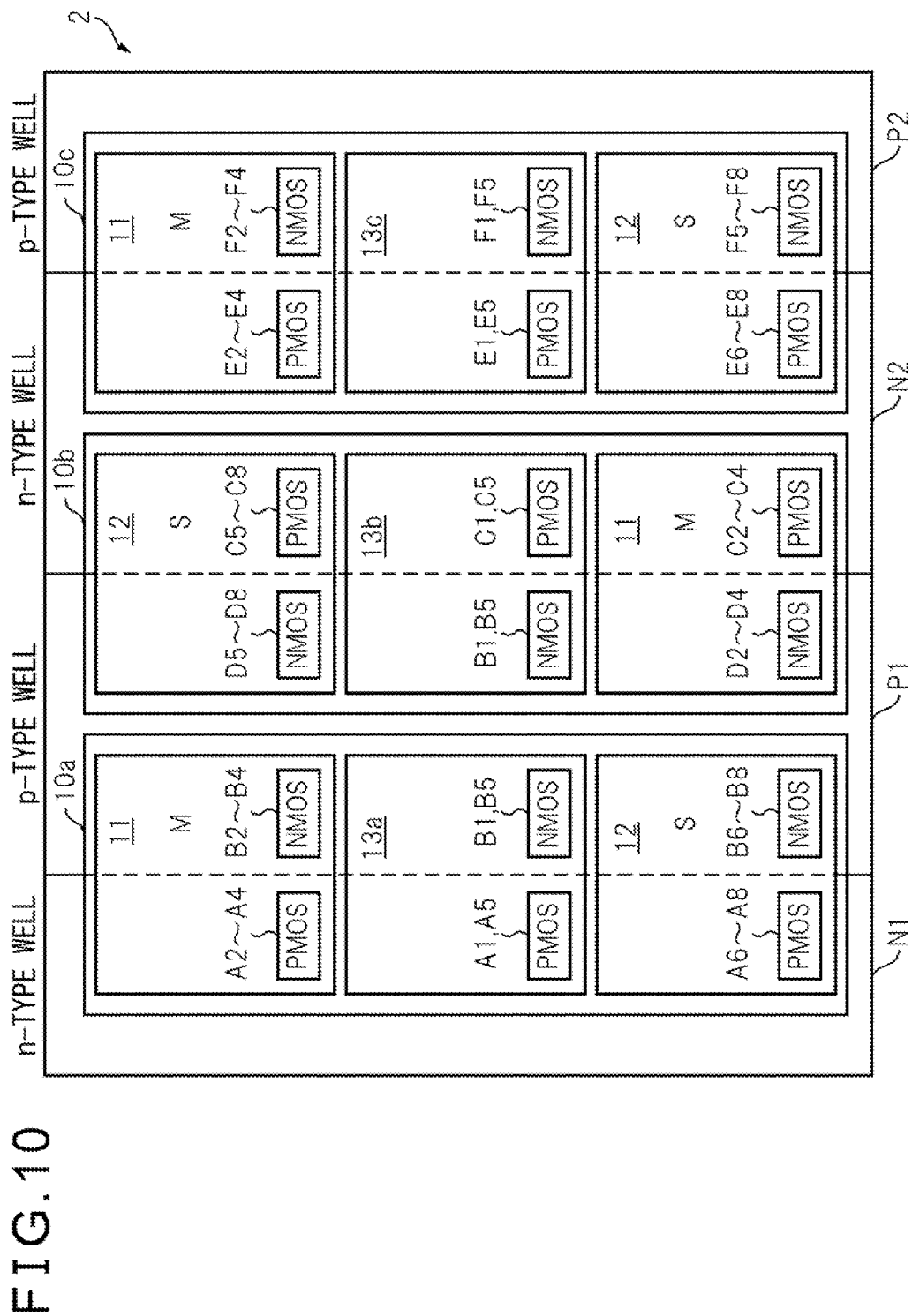
FIG. 10 is a diagram illustrating a second modified example of the third embodiment of the semiconductor device disclosed in this specification.

FIG. 10 is a diagram illustrating the second modified example of the third embodiment of the semiconductor device disclosed in this specification.

In the flip-flop circuit set 2 of this modified example, the direction in which the master latch circuit 11 and the slave latch circuit 12 in each of the MS FF circuits 10*a* to 10*c* are arranged by interposing the buffer circuit 13 therebetween is parallel to the direction along which the p-type wells P1 and P2 and n-type wells N1 and N2 extend. In this specification, the sentence "the direction in which the master latch circuit 11 and the slave latch circuit 12 are arranged is parallel to the direction along which the wells extend" is meant to include not only the case where the two directions are strictly parallel but also the case where they are substantially parallel.

Figure 11:
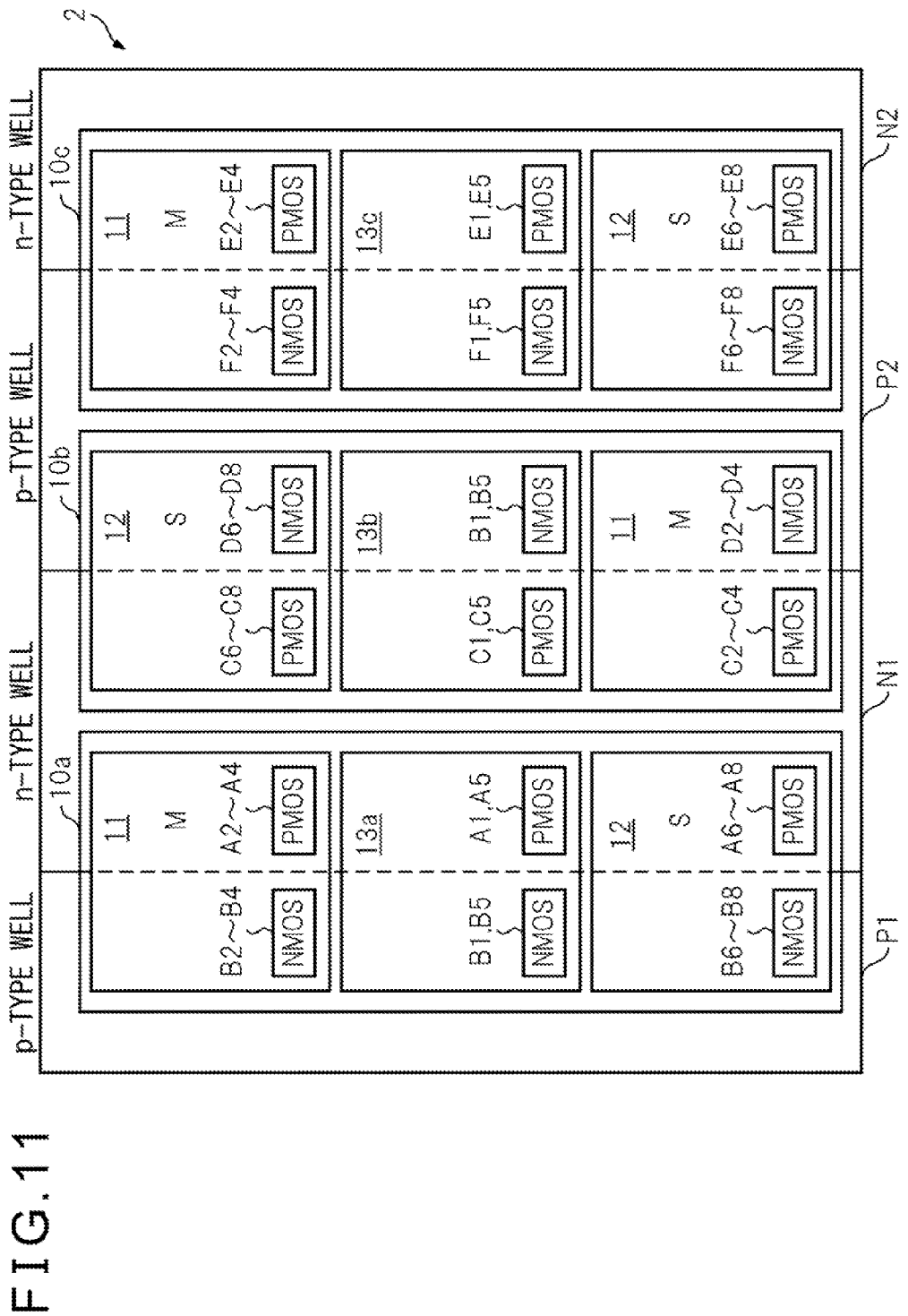
FIG. 11 is a diagram illustrating a third modified example of the third embodiment of the semiconductor device disclosed in this specification.

FIG. 11 is a diagram illustrating the third modified example of the third embodiment of the semiconductor device disclosed in this specification.

In this modified example, the arrangement of the n-type wells N1 and N2 and p-type wells P1 and P2 is different from that of the second modified example depicted in FIG. 10. That is, the n-type well N1 is formed between the p-type well P1 and the p-type well P2. The p-type well P2 is formed between the n-type well N1 and the n-type well N2.

FIG. 12 is a diagram illustrating the fourth modified example of the third embodiment of the semiconductor device disclosed in this specification.

In the flip-flop circuit set 2 of this modified example, the buffer circuit 13 disposed between the master latch circuit 11 and the slave latch circuit 12 in each of the MS FF circuits 10*a* to 10*c* is eliminated. Otherwise, the structure is the same as that of the second modified example depicted in FIG. 10.

In the present invention, the semiconductor device of each of the above embodiments can be modified appropriately without departing from the spirit and purpose of the present invention. Further, the constituent features of any one embodiment can be applied to other embodiments where appropriate.

What is claimed is:

1. A semiconductor device comprising:
    a first master-slave flip-flop circuit having a first master latch circuit which receives and latches a first data signal in synchronism with a first clock signal and a first slave latch circuit which receives and latches said first data signal from said first master latch circuit in synchronism with a second clock signal; and
    a second master-slave flip-flop circuit disposed side by side with said first master-slave flip-flop circuit and having a second master latch circuit which receives and latches a second data signal in synchronism with a third clock signal and a second slave latch circuit which receives and latches said second data signal from said second master latch circuit in synchronism with a fourth clock signal, and wherein said second slave latch circuit of said second master-slave flip-flop circuit is disposed adjacent to said first master latch circuit of said first master-slave flip-flop circuit, and said second master latch circuit of said second master-slave flip-flop circuit is disposed adjacent to said first slave latch circuit of said first master-slave flip-flop circuit.

2. A semiconductor device as claimed in claim 1, wherein a transistor of a first conductivity type, included in said first master latch circuit of said first master-slave flip-flop circuit, is formed in a first well of a second conductivity type, and a transistor of said first conductivity type, included in said second master latch circuit of said second master-slave flip-flop circuit, is formed in a second well of said second conductivity type which is a different well from said first well, and
    a transistor of said first conductivity type, included in said first slave latch circuit of said first master-slave flip-flop circuit, is formed in a third well of said second conductivity type, and a transistor of said first conductivity type, included in said second slave latch circuit of said second master-slave flip-flop circuit, is formed in a fourth well of said second conductivity type which is a different well from said third well.

3. A semiconductor device as claimed in claim 2, wherein said first well and said fourth well are the same well, and said second well and said third well are the same well.

4. A semiconductor device as claimed in claim 2, wherein a transistor of said second conductivity type, included in said first master latch circuit of said first master-slave flip-flop circuit, is formed in a fifth well of said first conductivity type, and a transistor of said second conductivity type, included in said second master latch circuit of said second master-slave flip-flop circuit, is formed in a sixth well of said first conductivity type which is a different well from said fifth well, and
    a transistor of said second conductivity type, included in said first slave latch circuit of said first master-slave flip-flop circuit, is formed in a seventh well of said first conductivity type, and a transistor of said second conductivity type, included in said second slave latch circuit of said second master-slave flip-flop circuit, is formed in an eighth well of said first conductivity type which is a different well from said seventh well.

5. A semiconductor device as claimed in claim 4, wherein said fifth well and said eighth well are the same well, and said sixth well and said seventh well are the same well.

6. A semiconductor device as claimed in claim 2, wherein said first master latch circuit and said first slave latch circuit are disposed one adjacent to the other in said first master-slave flip-flop circuit in a direction that intersects a direction along which the wells of said first conductivity type and the wells of said second conductivity type extend.

7. A semiconductor device as claimed in claim 2, wherein said first master latch circuit and said first slave latch circuit are disposed one adjacent to the other in said first master-slave flip-flop circuit in a direction parallel to a direction along which the wells of said first conductivity type and the wells of said second conductivity type extend.

8. A semiconductor device as claimed in claim 1, further comprising a parity master-slave flip-flop circuit having a parity master latch circuit which receives and latches, in synchronism with a fifth clock signal, a parity signal that is generated based on said first data signal latched in said first slave latch circuit of said first master-slave flip-flop circuit and on said second data signal latched in said second slave latch circuit of said second master-slave flip-flop circuit, and a parity slave latch circuit which receives and latches said parity signal from said parity master latch circuit in synchronism with a sixth clock signal, said parity master-slave flip-flop circuit being disposed side by side with said second master-slave flip-flop circuit on a side thereof opposite from said first master-slave flip-flop circuit, and wherein said parity slave latch circuit of said parity master-slave flip-flop circuit is disposed adjacent to said second master latch circuit of said second master-slave flip-flop circuit, and said parity master latch circuit of said parity master-slave flip-flop circuit is disposed adjacent to said second slave latch circuit of said second master-slave flip-flop circuit.

9. A semiconductor device as claimed in claim 1, wherein said first clock signal and said third clock signal are the same clock signal, and said second clock signal and said fourth clock signal are the same clock signal.

10. A semiconductor device comprising:

an arrangement of a plurality of master-slave flip-flop circuits each having a master latch circuit which receives and latches a first data signal in synchronism with a first clock signal and a slave latch circuit which receives and latches said first data signal from said master latch circuit in synchronism with a second clock signal, and wherein said master latch circuit of one of said master-slave flip-flop circuits is disposed adjacent to said slave latch circuit of another one of said master-slave flip-flop circuits, and said slave latch circuit of said one master-slave flip-flop circuit is disposed adjacent to said master latch circuit of said other master-slave flip-flop circuit.

* * * * *